United States Patent
Pan et al.

(10) Patent No.: US 7,247,252 B2
(45) Date of Patent: ***Jul. 24, 2007

(54) METHOD OF AVOIDING PLASMA ARCING DURING RIE ETCHING

(75) Inventors: Shing-Chyang Pan, Tainan (TW); Yu-Chun Huang, Hualien (TW); Shwangming Jing, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 188 days.

This patent is subject to a terminal disclaimer.

(21) Appl. No.: 10/175,613

(22) Filed: Jun. 20, 2002

(65) Prior Publication Data

US 2003/0235994 A1     Dec. 25, 2003

(51) Int. Cl.
*H01L 21/30* (2006.01)
(52) U.S. Cl. .................. 216/62; 216/67; 216/79; 216/80; 438/723; 438/734
(58) Field of Classification Search .................. 216/13, 216/17, 67; 427/535, 536; 438/694, 710, 438/723, 700, 714, 719, 724, 735, 743, 744
See application file for complete search history.

(56) References Cited

U.S. PATENT DOCUMENTS

| | | | | |
|---|---|---|---|---|
| 5,994,778 A * | 11/1999 | Huang et al. | ............... | 257/758 |
| 6,087,724 A * | 7/2000 | Shields et al. | ............... | 257/734 |
| 6,114,259 A * | 9/2000 | Sukharev et al. | ........... | 438/789 |
| 6,177,364 B1 * | 1/2001 | Huang | ........................ | 438/792 |
| 6,252,303 B1 * | 6/2001 | Huang | ........................ | 257/758 |
| 6,303,518 B1 * | 10/2001 | Tian et al. | ................... | 438/758 |
| 6,346,489 B1 * | 2/2002 | Cohen et al. | ............... | 438/789 |
| 6,372,654 B1 * | 4/2002 | Tokashiki | ................... | 438/712 |
| 6,372,670 B1 * | 4/2002 | Maeda | ........................ | 438/787 |
| 6,374,770 B1 * | 4/2002 | Lee et al. | ................. | 118/723 E |
| 6,391,772 B1 * | 5/2002 | Tokashiki et al. | ........... | 438/672 |
| 6,420,276 B2 * | 7/2002 | Oku et al. | ................... | 438/758 |
| 6,426,301 B1 * | 7/2002 | Shields et al. | ............. | 438/706 |
| 6,511,575 B1 * | 1/2003 | Shindo et al. | ......... | 204/298.34 |
| 6,521,547 B1 * | 2/2003 | Chang et al. | ............... | 438/781 |
| 6,524,972 B1 * | 2/2003 | Maeda | ........................ | 438/778 |
| 6,562,700 B1 * | 5/2003 | Gu et al. | ..................... | 438/477 |
| 6,589,873 B2 * | 7/2003 | Taguwa | ...................... | 438/694 |
| 6,653,247 B2 * | 11/2003 | MacNeil | ..................... | 438/798 |
| 6,656,832 B1 * | 12/2003 | Pan et al. | ................... | 438/627 |
| 6,677,251 B1 * | 1/2004 | Lu et al. | ..................... | 438/778 |
| 6,703,317 B1 * | 3/2004 | Cheng et al. | ............... | 438/716 |
| 6,759,342 B2 * | 7/2004 | Yao et al. | ................... | 438/718 |
| 6,781,393 B2 * | 8/2004 | Benjamin | ................... | 324/754 |
| 6,787,484 B2 * | 9/2004 | Yao et al. | ................... | 438/795 |
| 6,805,139 B1 * | 10/2004 | Savas et al. | ................. | 134/1.3 |
| 6,812,043 B2 * | 11/2004 | Bao et al. | ...................... | 438/4 |

(Continued)

*Primary Examiner*—Anita Alanko
(74) *Attorney, Agent, or Firm*—Thomas, Kayden, Horstemeyer & Risley

(57) ABSTRACT

A method for avoiding plasma arcing during a reactive ion etching (RIE) process including providing a semiconductor wafer having a process surface for depositing a dielectric insulating layer; depositing at least a portion of a dielectric insulating layer to form a deposition layer according to plasma assisted chemical vapor deposition (CVD) process; treating the deposition layer portion with a hydrogen plasma treatment to reduce an electrical charge nonuniformity of the deposition layer including applying a biasing power to the semiconductor wafer; and, carrying out a subsequent reactive ion etching process.

18 Claims, 2 Drawing Sheets

U.S. PATENT DOCUMENTS

| | | | |
|---|---|---|---|
| 6,821,905 B2 * | 11/2004 | Pan et al. | 438/706 |
| 6,846,756 B2 * | 1/2005 | Pan et al. | 438/798 |
| 2002/0177329 A1 * | 11/2002 | Yang et al. | 438/798 |
| 2004/0072405 A1 * | 4/2004 | Yao et al. | 438/393 |
| 2004/0115943 A1 * | 6/2004 | Yao et al. | 438/692 |
| 2005/0032253 A1 * | 2/2005 | Hsu et al. | 438/17 |

* cited by examiner

METHOD OF AVOIDING PLASMA ARCING DURING RIE ETCHING

FIELD OF THE INVENTION

This invention generally relates to anisotropic plasma etching processes and more particularly to a method for reducing plasma arcing induced defects during RIE anisotropic etching of dielectric insulating layers in semiconductor manufacturing processes.

BACKGROUND OF THE INVENTION

As devices become smaller and integration density increases, reactive ion etching (RIE) has become a key process in anisotropic etching of semiconductor features. RIE or ion-enhanced etching works by a combination of physical and chemical mechanisms for achieving selectivity and anisotropicity during the etching process. Generally, plasma assisted anisotropic etching operates in the milliTorr and above range. Generally three processes compete with each other during plasma etching; physical bombardment by ions, chemical etching by radicals and ions, and surface passivation by the deposition of passivating films. In some applications, for example, etching high aspect ratio features such as vias, high density plasma (HDP) etching which has a higher density of ions and operates at lower pressures has been increasingly used in etching high aspect ratio features, for example, with aspect ratios greater than about 3:1. One variable for increasing anisotropicity in etching high aspect ratio openings is to vary the RF power for altering the concentration of ions and radicals and to vary the bias power applied to the semiconductor wafer for varying the energy of the impacting ions and radicals.

During the formation of semiconductor devices it is often required that the conductive layers be interconnected through holes in an insulating layer also referred to as an inter-metal dielectric (IMD) layer. Such holes are commonly referred to as contact holes, i.e., when the hole extends through an insulating layer to an active device area, or vias, i.e., when the hole extends through an insulating layer between two conductive layers. The profile of a hole is of particular importance since that it exhibits specific electrical characteristics when the contact hole or via is filled with a conductive material. Typically, the holes are high aspect ratio holes, meaning that the ratio of length to width is greater than about 3. Such holes are typically formed by a reactive ion etching (RIE) process where complex chemical processes assisted by ion bombardment result in relatively higher etching rates in one direction versus another, known as anisotropic etching. The relative anisotropicity or selectivity of the etching process will in turn determine the etching profile of an etched hole and consequently its aspect ratio. As semiconductor structures are inevitably driven to smaller sizes, successful etching of higher aspect ratio holes is becoming more difficult.

In anisotropically etching contact or via holes (openings), plasmas containing fluorocarbons or hydrofluorocarbons including oxygen and nitrogen are typically optimized in various steps in a plasma etch process to selectively etch through the various layers of materials included in a multi-layered semiconductor device. For example, it is typically required to selectively etch through a metal nitride or silicon carbide layer forming the etching stop layer prior to etching the contact or via hole through the IMD layer while minimizing the etching of an overlying patterned photoresist layer. For example, plasmas containing fluorocarbons or hydrofluorocarbons such as $CF_4$ and $CHF_3$ are used to etch through the etching stop layer and more carbon rich hydrofluorocarbons such as $C_4F_6$ are used to etch through the etching stop layer and the inter-metal dielectric (IMD) layer. Using carbon-rich hydrofluorocarbons containing plasmas provides a means of selectively etching high aspect ratio contact and via holes through oxide layers such as an IMD layer while minimizing etching of the overlying hardmask or etching stop layer.

Another plasma process common in semiconductor manufacturing are plasma assisted chemical vapor deposition (CVD) assisted techniques, including PECVD and HDP-CVD. In particular, high density plasma (HDP) processes, such as electron cyclotron resonance (ECR) processes and induced coupling plasma (ICP) processes have been found to produce high-quality low dielectric constant (e.g., <3.0) carbon doped silicon oxide. Generally, HDP-CVD provides a high density of low energy ions resulting in higher quality films at lower deposition temperatures, compared to for example, PECVD. HDP-CVD is particularly ideal for forming inter-metal dielectric (IMD) insulating oxide layers because of its superior gap filling capability.

A common phenomena in multi-level semiconductor devices, for example, including 5 to 8 levels of dielectric insulating layers having metal filled interconnects such as vias or trench lines, is charge accumulation related to the various plasma assisted processes such as deposition and anisotropic etching. Depending on the various process parameters such as RF power and bias power, impacting ions and radical may cause the accumulation of charge within the dielectric insulating layers due to charge imbalances caused by non-uniformities in the plasma and charge non-uniformities caused by the etching target. For example, charged species may become incorporated within the surface of the layer, with localized charge accumulation aided by defects formed in the dielectric insulating layer. In addition, ion and radical bombardment may increase the concentration of charged defects at localized portions of the surface, thereby increasing localized charge buildup within the layer. As dielectric insulating layers have decreased in dielectric constant, their increased electrical insulating characteristics also contribute to the localized buildup of electrical charge within the insulating portion of the multi-level device. The electrical charge build-up is frequently long lasting, lasting at least for several hours.

One detrimental effect of the localized accumulation of charge in the dielectric insulating layer and exacerbated by non-uniformities in the plasma is exhibited during RIE etching processes, for example, in anisotropically etching vias. As previously mentioned, in achieving the required anisotropicity for high aspect ratio features a delicate balance between the concentration of ions and radicals and the energy of ion and radical bombardment is required. The problem of arcing or electrical discharge of the plasma to localized charged areas on the semiconductor wafer has increasingly become a critical problem in RIE processes. The increased incidence of arcing damage is believed to be related to the increased localization of unequal charge distribution in low dielectric constant insulating layers together with the plasma processing parameters necessary to achieve high aspect ratio anisotropic etching.

The arcing damage typically occurs in the vicinity of metallization line, believed to provide a pathway to localized charged areas in the dielectric insulating layer. The problem is critical since the damage caused by the arcing typically is typically severe and the extent of damage to underlying regions and surrounding areas not readily ascertainable making further processing of the wafer impractical. As a result, arcing damage to the wafer is costly in terms of wafer yield and reliability.

There is therefore a need in the semiconductor processing art to develop a method whereby plasma arcing is avoided during anisotropic etching of dielectric insulating layers thereby avoiding arcing induced defects to the semiconductor wafer to improve wafer yield and device reliability.

It is therefore an object of the invention to provide a method whereby plasma arcing is avoided during anisotropic etching of dielectric insulating layers thereby avoiding arcing induced defects to the semiconductor wafer to improve wafer yield and device reliability while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for avoiding plasma arcing during a reactive ion etching (RIE) process.

In a first embodiment, the method includes providing a semiconductor wafer having a process surface for depositing a dielectric insulating layer; depositing at least a portion of a dielectric insulating layer to form a deposition layer according to plasma assisted chemical vapor deposition (CVD) process; treating the deposition layer portion with a hydrogen plasma treatment to reduce an electrical charge nonuniformity of the deposition layer including applying a biasing power to the semiconductor wafer; and, carrying out a subsequent reactive ion etching process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figures 1A, 1B:
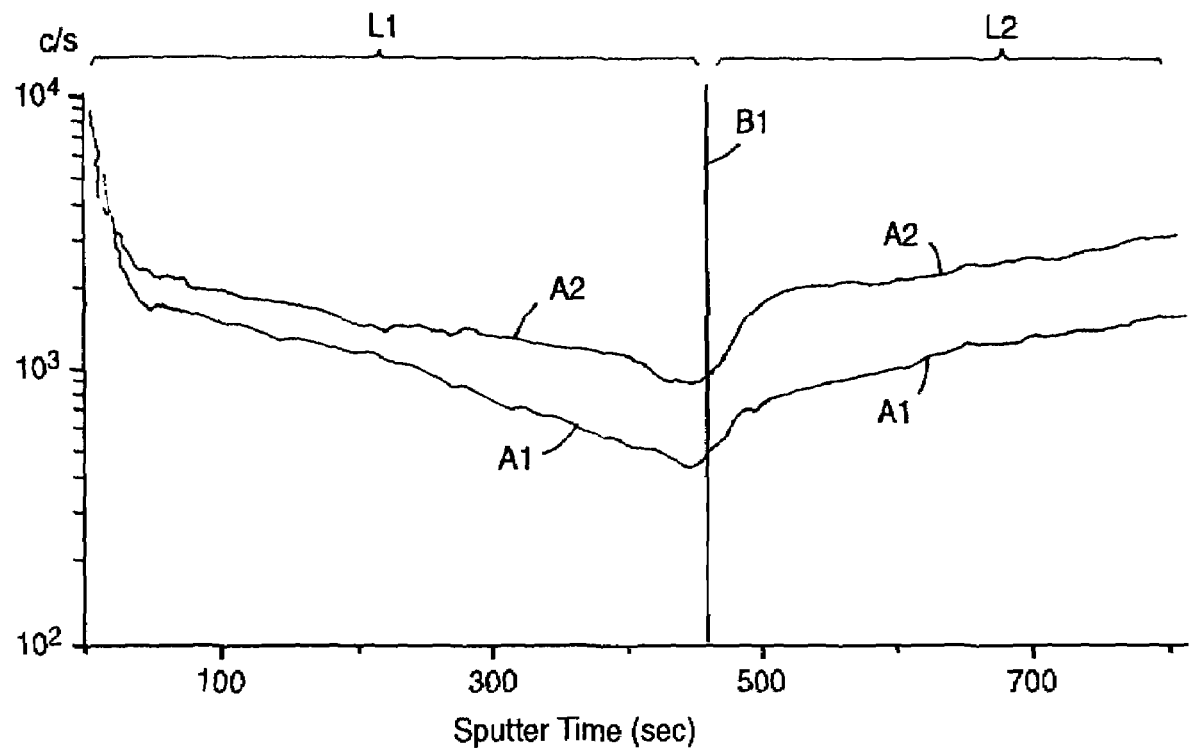
FIG. 1A is an exemplary graph of SIMS sputtering data comparing the relative hydrogen concentration makeup of a non-treated dielectric insulating layer according to the prior art and a hydrogen plasma treated dielectric insulating layer according to an embodiment of the present invention.
FIG. 1B is a table of exemplary charge measurement data showing the effect of the hydrogen plasma treatment surface according to an embodiment of the present invention on relative electrical charging over the wafer process.

According to the present invention a hydrogen plasma treatment processing method is presented to avoid or reduce arcing discharge during a reactive ion etching (RIE) process. Although the present invention is explained by exemplary reference to the formation of a particular level of a multi-level (multi-layer) semiconductor device it will be appreciated that hydrogen plasma treatment of the present invention may be advantageously applied after the formation of each layer of dielectric insulating material. It will further be appreciated that the hydrogen plasma treatment method while explained with reference to a carbon doped oxide, it will be appreciated that the method of the present invention may in general be applied to silicon oxide containing dielectric layers to reduce an electrical charge imbalance including reducing negatively charged portions of the dielectric insulating layer.

In a first embodiment a semiconductor process surface including at least a portion of a dielectric insulating layer formed by a plasma assisted CVD process is provided. A hydrogen plasma treatment is then carried out including reducing (neutralizing) a charge distribution imbalance in the dielectric insulating layer. The hydrogen plasma treatment process is preferably repeated in-situ following deposition of a dielectric layer portion or at least prior to the deposition of an overlying semiconductor device layer.

In one embodiment, the dielectric insulating layer is formed by a PECVD or HDP-CVD process to form a dielectric layer having a thickness of from about 500 Angstroms to about 10,000 Angstroms, more preferably, about 1000 Angstroms to about 8000 Angstroms. In another embodiment the hydrogen plasma treatment is carried out following the formation of each dielectric insulating layer portion in a multi-level device. In another embodiment, the dielectric insulating layer is formed in a multi-step process with a portion of the dielectric insulating layer formed, preferably from about ¼ of the final thickness to about ½ of the final thickness, with the hydrogen plasma treatment performed to neutralize electrically charged portions of the dielectric layer portion carried following each dielectric layer portion deposition or at least prior to the deposition of an overlying semiconductor device layer. In another embodiment, the dielectric layer portions have a dielectric constant of less than about 3.0.

In one embodiment, the dielectric insulating layer is formed of any silicon oxide containing material including, for example, silicon dioxide, carbon doped oxide (C-oxide), organo-silicate glass (OSG), undoped silicate glass (USG), and fluorinated silicate glass (FSG). In another embodiment, the dielectric insulating layer is a carbon doped oxide formed by a plasma assisted CVD process, for example PECVD or HDP-CVD, using organosilane precursors. By the term 'organo-silane' precursors is meant precursors including Si-O groups and Si-$R_y$ groups, where R is an alkyl or cyclo-alkyl group and y the number of R groups bonded to Si. For example, the R group is a methyl ($CH_3$) group. For example, precursors including tetra-methyl-silane (4MS), tri-methyl-silane (3MS), and other organo-silane precursors adaptable to CVD deposition are suitably used.

In a preferred embodiment according to the present invention, the hydrogen plasma treatment is preferably carried out immediately following deposition of the dielectric insulating layer or a portion thereof. For example, a portion of a dielectric insulating layer, for example, from about ¼ to about ½ of the final thickness is deposited followed by the hydrogen plasma treatment performed in-situ in the same reactor or transferred to another plasma reactor to neutralized electrically charge portions of the dielectric layer. The hydrogen plasma treatment may be alternatively be carried out prior to deposition of another material layer overlying the dielectric insulating layer, for example, another dielectric insulating layer or a metal nitride etching stop layer, capping layer, or dielectric anti-reflectance coating (DARC) layer formed of, for example, silicon oxynitride.

In a preferred embodiment, the hydrogen plasma treatment is a high density plasma (HDP) treatment. For example, the hydrogen plasma treatment is carried out at a pressure of from about 1 milliTorr to about 100 milliTorr, more preferably from about 3 milliTorr to about 10 milliTorr. The hydrogen plasma treatment is preferably carried out with the substrate process wafer temperature preheated to about 200° C. to about 400° C., more preferably about 350° C. A mixture of gases, individually or separately fed, is supplied to form a plasma source gas to maintain the plasma including about 5 percent to about 20 percent by volume hydrogen ($H_2$) of the total volume of the plasma source gas with a remaining portion including an inert gas, for example, helium or argon, or mixtures thereof. The hydrogen containing plasma is maintained by applying an RF power level of about 200 Watts to about 600 Watts. A high bias power of AC or DC bias is applied to the wafer substrate at about 100 Watts to about 500 Watts to accelerate hydrogen bombardment and assist hydrogen penetration to neutralize a charge imbalance in the dielectric insulating layer. The hydrogen plasma treatment is preferably carried out for a period of about 20 seconds to about 60 seconds In one embodiment, the dielectric insulating layer is a low-k dielectric insulating layer the term 'low-k' meaning having a dielectric constant of less than about 3.0, for example, a carbon doped oxide layer. The carbon doped oxide layer is deposited in a multi-step process where a portion of the carbon doped oxide layer is deposited and the hydrogen plasma treatment is carried out following each deposition step or prior to the next deposition step. For example, if the final thickness of the dielectric insulating layer, for example an IMD layer is about 8000 Angstroms, in the multi-deposition process, at least about a ¼ i.e., about 2000 Angstroms of the carbon doped oxide layer is preferably deposited followed by the hydrogen plasma treatment, the deposition step and the hydrogen plasma treatment step being repeated with equal deposition thicknesses to reach a final IMD layer thickness. It will appreciated that the multi-step process may deposit unequal insulating dielectric thickness portions in each deposition step, however, equal thickness depositions are preferred to maximize the efficiency of neutralizing charge imbalances.

It is believed the hydrogen plasma ions bombard the surface of the dielectric insulating layer including negatively charged portions neutralizing the charge imbalance to produce a relatively uniformly distributed electrical charge thereby avoiding arcing discharges in a subsequent RIE etching process. The application of the bias power to the wafer substrate acts to assist hydrogen ion penetration and drain any excess electrical charge moving to conductive electrical pathways. For example, in an exemplary embodiment it has been found that the hydrogen content of the dielectric insulating layer is increased over the thickness of the dielectric insulating layer.

Referring to FIG. 1A is shown a spectrograph of a secondary ion mass spectroscopy (SIMS) measurement carried out over a portion of a dielectric insulating layer formed of a carbon doped oxide with a tantalum nitride overlayer prior to and following the hydrogen plasma treatment. Represented on the vertical axis are counts per second (c/s) of detected species sputtered from the surface, proportional to their relative concentration, and on the horizontal axis, sputter time in seconds, proportional to a thickness of sputtered material through the thickness of the layers. Line B1 represents the interface between tantalum nitride and the carbon doped oxide insulating layer reached upon sputtering through the tantalum nitride represented by thickness portion L1 followed by sputtering through thickness portion L2 representing a thickness portion of the carbon doped oxide insulating layer. For simplicity, only the detected hydrogen portion of the data is shown. Line A1 represents the hydrogen concentration over the thickness of the tantalum nitride layer in thickness portion L1 and the carbon doped oxide layer in thickness portion L2. Line A1 in thickness portion L2 of the carbon doped oxide layer represents the relative hydrogen concentration following deposition of the carbon doped oxide layer without the hydrogen plasma treatment. Line A2 in thickness portion L2 of the carbon doped oxide layer represents the relative hydrogen concentration following deposition of the carbon doped oxide layer following the hydrogen plasma treatment according to preferred embodiments of the invention. It is seen that the hydrogen concentration in both the tantalum nitride layer (thickness portion L1) and the carbon doped oxide layer (thickness portion L2) is increased following the hydrogen plasma treatment (line A2).

Referring to FIG. 1B is shown a table of values representing maximum and minimum measured charge values carried out over the die or chip portions of the wafer for both a bare silicon wafer and including an exposed layer of carbon doped oxide. Column A gives the wafer condition, i.e., either a bare silicon wafer (bare wafer) or a wafer including a layer of carbon doped oxide (Ox wafer). Column B indicates the wafer condition under which electrical charge measurements were made with respect to '$H_2$ plasma treatment', i.e., 'Yes' ($H_2$ plasma treatment) or 'No' (no $H_2$ plasma treatment), following layer deposition except in the case of a bare silicon wafer. Column C represents a maximum value of measured electrical charge in units of $10^{11}$ coulombs/cm$^2$ while column D represents a minimum value of measured electrical charge in the same units. Referring to rows A1 and A3 it can be seen without hydrogen plasma treatment, both the bare silicon wafer and the carbon doped oxide layer show a significant absolute value difference including positive and negative charges indicating a non-uniform charge distribution (charge imbalance). In contrast, referring rows A2 and A4, after carrying out the hydrogen plasma treatment, both the bare silicon wafer and the carbon doped oxide layer show a significantly reduced absolute difference in charge distribution (charge imbalance) and a relatively uniform positive charge distribution over the wafer surface.

In an exemplary implementation of the present invention an arcing rate was determined in anisotropically etching via openings into a dielectric insulating layer according to an RIE process with and without the hydrogen plasma treatment according to the present invention. Following a hydrogen treatment according to the present invention an arcing rate without the hydrogen treatment of about 50% to about 66% in via etching was reduced to about 0% following the hydrogen plasma treatment according to an embodiment of the present invention.

Figure 2A:
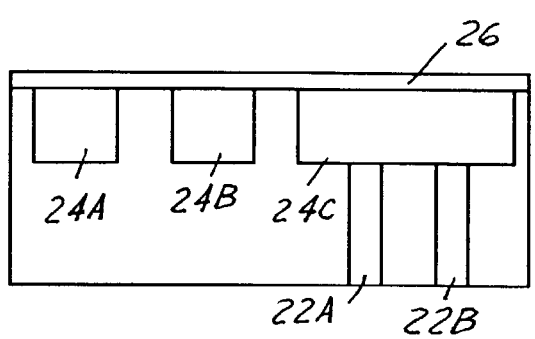
FIGS. 2A-2D are cross sectional side view representations of an exemplary portion of a semiconductor wafer at stages of manufacture according to the present invention.
Figure 2B:
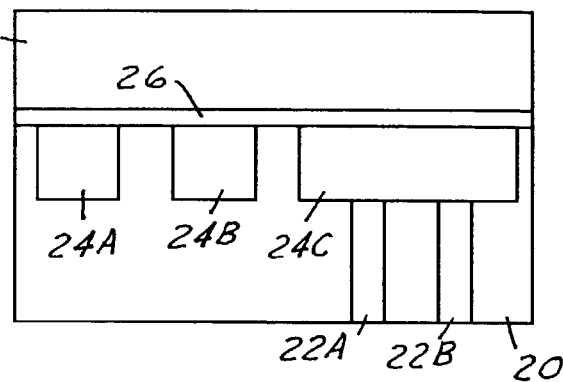
Figure 2C:
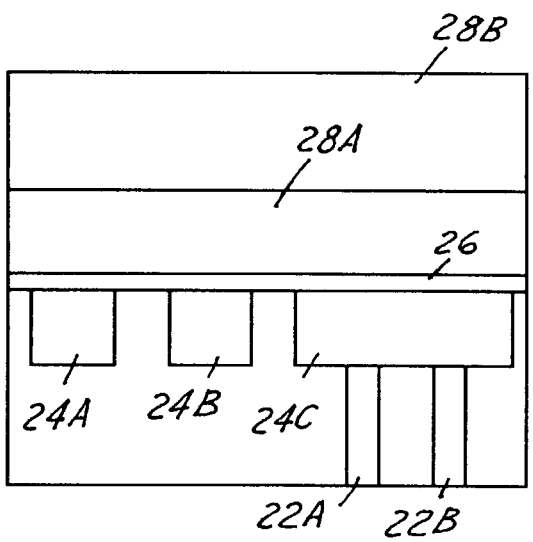

Referring to FIG. 2A through 2C are shown cross sectional side view representations of stages in manufacture of a semiconductor device according to an exemplary embodiment of the present invention. Referring to FIG. 2A, is shown a dielectric insulating layer (IMD layer) 20, for example a carbon doped oxide layer having a thickness of from about 4000 to about 10000 Angstroms having formed therein metal interconnect lines, e.g., copper filled vias 22A and 22B. Metallization areas 24A, 24B, and 24C, for example, copper filled trench lines have been formed to provide electrical interconnections between various portions of the device level and between levels by e.g., vias 22A, 22B and trench line 24C. An etching stop layer 26 of, for example, silicon carbide (e.g., SiC), silicon nitride (e.g., SiN), or silicon oxynitride (e.g., SiON) having a thickness of from about 400 Angstroms to about 800 Angstroms is formed over the IMD layer 20.

Referring to FIG. 2B, a first dielectric insulating layer portion 28A is deposited, formed of, for example, carbon doped oxide according to a PECVD process having a thickness of about 2000 to about 4000 Angstroms. Following the deposition of the first dielectric insulating layer portion 28A, a hydrogen plasma treatment according to the preferred embodiments of the invention is carried out. For example, a $H_2$/He gas mixture with about 5% by volume $H_2$ is supplied to form a plasma maintained by applying RF power at about 400 Watts, with a bias power supplied to the wafer substrate at about 300 Watts, the wafer substrate being preheated to about 350° C. The hydrogen plasma treatment is carried out for a period of about 20 to 60 seconds, preferably 60 seconds.

Referring to FIG. 2C, a second dielectric insulating layer portion 28B is deposited, formed of, for example, carbon doped oxide according to a PECVD process having a thickness of about 2000 to about 4000 Angstroms to complete an IMD layer thickness. Following the deposition of the second dielectric insulating layer portion 28B, a hydrogen plasma treatment according to the preferred embodiments of the invention is carried out.

Figure 2D:
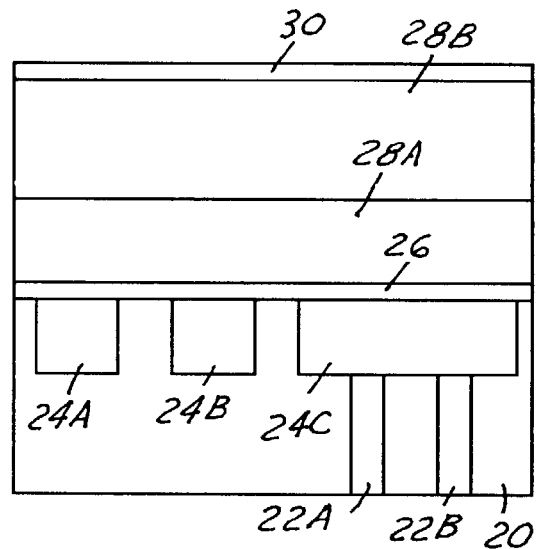

Referring to FIG. 2D, following the hydrogen plasma treatment, a capping layer 30, for example a DARC layer formed of, for example, silicon oxynitride having a thickness of about 300 Angstroms to about 800 Angstroms is formed overlying the IMD layer, for example, second dielectric insulating layer portion 28B. Subsequent processes, not shown, including photolithographic patterning and a RIE anisotropic etching process are carried out to form via openings, for example, having an aspect ratio of greater than about 3.0, to form metallization areas including vias and trench lines similar to those shown in IMD layer 20. It will be appreciated that the hydrogen plasma treatment is preferably carried out following each instance of deposition of a dielectric insulating layer in the manufacture of a multi-level device to reduce the buildup of charge imbalance and thereby prevent arcing in an RIE etching process subsequently carried out on the dielectric insulating layer.

Figure 3:
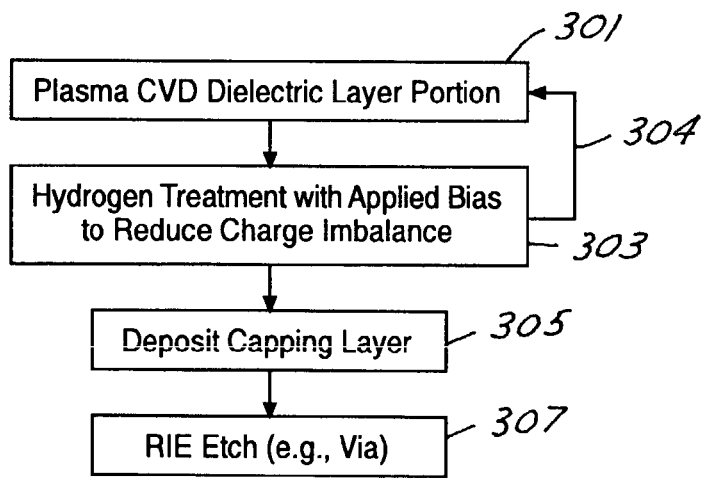
FIG. 3 is an exemplary process flow diagram including several embodiments of the present invention.

Referring to FIG. 3 is shown a process flow diagram including several embodiments of the present invention. A semiconductor wafer process surface is provided for forming a dielectric insulating layer thereover. In process 301, a dielectric insulating layer portion, preferably formed by a plasma assisted CVD process, for example PECVD. In process 303, a hydrogen plasma treatment according to preferred embodiments is carried out to neutralize (reduce) a charge imbalance of the dielectric insulating layer thereby reducing a charge distribution nonuniformity. As indicated by directional process arrow 304, processes 301 and 303 may optionally be repeated in a multiple layer deposition process to form an IMD layer. In process 305 a capping layer is provided over the IMD layer. In process 307 a reactive ion etching process is carried to anisotropically etch openings in the IMD layer, for example via openings, following a conventional photolithographic patterning process.

Thus, there has been present a method whereby plasma arcing is avoided during anisotropic etching of dielectric insulating layers thereby avoiding arcing induced defects to the semiconductor wafer to improve wafer yield and device reliability while overcoming other shortcomings and deficiencies of the prior art.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for avoiding plasma arcing during a reactive ion etching (RIE) process comprising:
   providing a semiconductor wafer comprising a process surface for depositing a dielectric insulating layer;
   depositing at least a portion of the dielectric insulating layer according to plasma assisted chemical vapor deposition (CVD) process, the dielectric insulating layer comprising an electrical charge imbalance, said dielectric insulating layer selected from the group consisting of silicon dioxide, carbon doped oxide (C-oxide), organo-silicate glass (OSG), and undoped silicate glass (USG);
   treating the dielectric insulating layer surface according to a hydrogen containing plasma treatment consisting of hydrogen gas and an inert gas, said plasma treatment further comprising a biasing power to reduce the electrical charge imbalance; and,
   carrying out a subsequent reactive ion etching process to etch openings in the dielectric insulating layer.

2. The method of claim 1, wherein the steps of depositing and treating are sequentially performed more than once to complete formation of a final thickness of the dielectric insulating layer.

3. The method of claim 2, wherein dielectric insulating layer thickness portions formed in each step of depositing are about equal.

4. The method of claim 1, wherein the plasma assisted CVD process is selected from the group consisting of a plasma enhanced CVD (PECVD) process and a high density plasma CVD (HDP-CVD) process.

5. The method of claim 1, wherein the dielectric insulating layer comprises a dielectric constant of less than about 3.0.

6. The method of claim 1, wherein the hydrogen containing plasma treatment consists of about 5 percent to about 20 percent by volume of hydrogen gas with a remaining portion comprising an inert gas.

7. The method of claim 1, wherein the hydrogen containing plasma treatment comprises preheating the semiconductor substrate to about 250 degrees Centigrade to about 400 degrees Centigrade; forming a hydrogen containing plasma at a pressure of about 1 milliTorr to about 100 milliTorr; applying an RF power of about 200 Watts to about 600 Watts; and, applying the biasing power from about 100 to about 500 Watts.

8. The method of claim 7, wherein the hydrogen containing plasma treatment is carried out for a plasma treatment period of about 20 to about 60 seconds.

9. The method of claim 1 wherein a capping layer is formed over the dielectric insulating layer prior to carrying out the reactive ion etching process.

10. A method for avoiding plasma arcing during a reactive ion etching (RIE) process comprising:
    providing a semiconductor wafer comprising a process surface for depositing a dielectric insulating layer;
    depositing at least a portion of the dielectric insulating layer to form a deposition layer according to plasma assisted chemical vapor deposition (CVD) process, the dielectric insulating layer comprising an electrical charge imbalance, said dielectric layer comprising carbon doped oxide;
    treating the deposition layer surface portion with a hydrogen containing plasma treatment to reduce the electrical charge imbalance wherein said hydrogen containing plasma treatment comprises hydrogen gas and an inert gas; and, carrying out a subsequent reactive ion etching process on the deposition layer.

11. The method of claim 10, wherein the steps of depositing and treating are sequentially performed more than once to form a final thickness of the dielectric insulating layer.

12. The method of claim 10, wherein the plasma assisted CVD process is selected from the group consisting of a plasma enhanced CVD (PECVD) process and a high density plasma CVD (HDP-CVD) process.

13. The method of claim 10, wherein the dielectric insulating layer comprises a dielectric constant of less than about 3.0.

14. The method of claim 10, wherein the hydrogen containing plasma treatment processing conditions comprise a plasma gas source mixture comprising about 5 percent to about 20 percent by volume of hydrogen gas with a remaining portion comprising an inert gas.

15. The method of claim 10, wherein the hydrogen containing plasma treatment comprises preheating the semiconductor substrate to about 250 degrees Centigrade to about 400 degrees Centigrade; forming a hydrogen containing plasma at a pressure of about 1 milliTorr to about 100 milliTorr; applying an RF power of about 200 Watts to about 600 Watts; and, applying a biasing power at between about 100 and 500 Watts.

16. The method of claim 15, wherein the hydrogen containing plasma treatment is carried out for a period of about 20 to about 60 seconds.

17. The method of claim 1, wherein the hydrogen containing plasma treatment is carried out in-situ following the step of depositing.

18. A method for avoiding plasma arcing during a reactive ion etching (RIE) process comprising:

providing a semiconductor wafer comprising a process surface for depositing a dielectric insulating layer;

depositing at least a portion of the dielectric insulating layer to form a deposition layer according to plasma assisted chemical vapor deposition (CVD) process, the dielectric insulating layer comprising a negatively charged electrical charge imbalance;

treating the deposition layer surface portion with a hydrogen containing plasma treatment comprising hydrogen gas and an inert gas to reduce the electrical charge imbalance wherein said hydrogen containing plasma treatment comprises a bias power;

wherein the steps of depositing and treating are sequentially performed more than once to complete formation of a final thickness of the dielectric insulating layer; and, carrying out a subsequent reactive ion etching process on the deposition layer.

* * * * *